United States Patent [19]

Nii

[11] Patent Number: 5,748,541

[45] Date of Patent: May 5, 1998

[54] LATCH CIRCUIT OPERATING IN SYNCHRONIZATION WITH CLOCK SIGNALS

[75] Inventor: Koji Nii, Tokyo, Japan

[73] Assignee: Mitsubishi Denki Kabushiki Kaisha, Tokyo, Japan

[21] Appl. No.: 757,728

[22] Filed: Nov. 26, 1996

[30] Foreign Application Priority Data

May 16, 1996 [JP] Japan .................................. 8-121741

[51] Int. Cl.$^6$ ............................................. G11C 7/00
[52] U.S. Cl. ............................. 365/189.05; 365/233
[58] Field of Search ......................... 365/189.05, 233, 365/191, 194

[56] References Cited

U.S. PATENT DOCUMENTS

| | | | |
|---|---|---|---|
| 5,073,873 | 12/1991 | Nogami | 365/189.05 |
| 5,491,667 | 2/1996 | Sharp | 365/205 |
| 5,568,429 | 10/1996 | D'Souza | 365/189.05 |

FOREIGN PATENT DOCUMENTS

| | | |
|---|---|---|
| 62-57196 | 3/1987 | Japan . |
| 2-116089 | 4/1990 | Japan . |
| 6-139769 | 5/1994 | Japan . |

Primary Examiner—David C. Nelms
Assistant Examiner—Son Mai

[57] ABSTRACT

A latch circuit operating in synchronization with clock signal comprises a memory unit including first and second inverters, the output terminal of the first inverter being connected to the input terminal of the second inverter and the output terminal of the second inverter being connected to the input terminal of the first inverter; a first switching unit coupling the input terminal of the first inverter with the ground; second and third switching units connected together in series and between the ground and the input terminal of the second inverter; a first control unit for controlling the first switching unit according to data signals received from outside; a second control unit for controlling the second switching unit according to the data signals; a delay unit for transmitting, with delay, the signal level at the input terminal of the second inverter, and a third control unit for controlling the third switching unit according to both the clock signals received from outside and the signal levels transmitted through the delay unit.

20 Claims, 5 Drawing Sheets

LATCH CIRCUIT OPERATING IN SYNCHRONIZATION WITH CLOCK SIGNALS

BACKGROUND OF THE INVENTION

1. Field of the Invention

The present invention relates to a semiconductor integrated circuit, particularly to a latch circuit operating in synchronization with clock signals.

2. Description of the Prior Art

Figure 10:
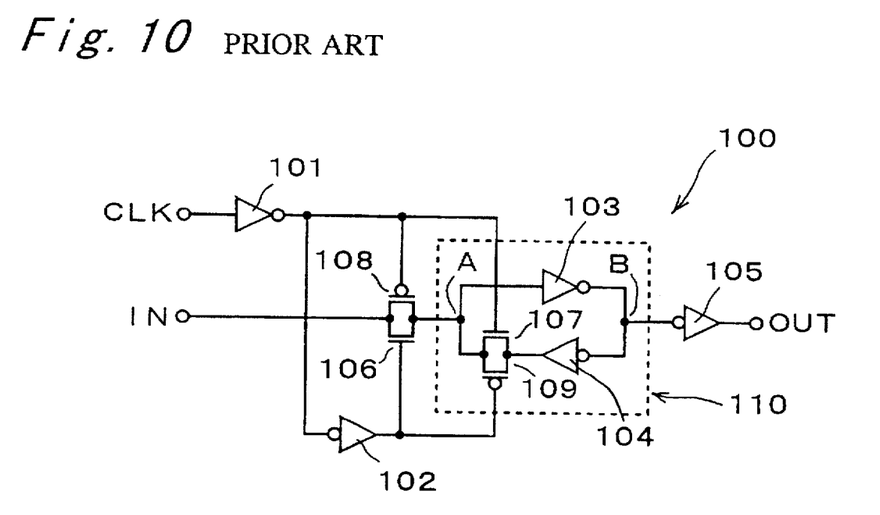
FIG. 10 is the circuit diagram of a latch circuit of a conventional latch circuit.

FIG. 10 is a circuit diagram showing a conventional latch circuit. A latch circuit 100 shown in FIG. 10 comprises five inverters 101, 102, 103, 104, and 105, two N-channel MOS (referred to as NMOS herein after) 106 and 107, and two P-channel MOS (referred to as PMOS herein after) 108 and 109. The drains of the NMOS transistor 107 and the PMOS transistor 109 are connected to each other; their sources are also connected to each other.

The connected drains of the NMOS transistor 107 and the PMOS transistor 109 are connected to the input terminal of the inverter 103. The connected sources of the NMOS transistor 107 and the PMOS transistor 109 are connected to the output terminal of the inverter 104. The output terminal of the inverter 103 is connected to the input terminal of the inverter 104 so that the inverters 103 and 104 and the NMOS transistor 107 and the PMOS transistor 109 form a memory circuit 110.

Similarly, the drains of the NMOS transistor 106 and the PMOS transistor 108 are connected to each other; their sources are also connected to each other. The connected drains of the NMOS transistor 106 and the PMOS transistor 108 are connected to the input terminal of the inverter 103. The connected sources of the NMOS transistor 106 and the PMOS transistor 108 are connected to the input terminal IN of the latch circuit 100. The gates of the NMOS transistor 107 and the PMOS transistor 108 are connected together to the output terminal of the inverter 101. The inverter 101 receives external clock signals through the clock input terminal CLK.

The gates of the NMOS transistor 106 and the PMOS transistor 109 are connected together to the output terminal of the inverter 102. The input terminal of the inverter 102 is connected to the output terminal of the inverter 101. The connection point of the output terminal of the inverter 103 and the input terminal of the inverter 104 is connected to the input terminal of the inverter 105. The output of the inverter 105 is also the output of the latch circuit 100 and is sent out through the OUT terminal. Hereinafter, the connection point of the input terminal of the inverter 103, the drain of the NMOS transistor 107, and the drain of the PMOS transistor 109 is referred to as the point A. The connection point of the output terminal of the inverter 103 and the input terminal of the inverter 104 is referred to as the point B. The NMOS transistor 106 and the PMOS transistor 108 form a transmission gate; similarly, the NMOS transistor 107 and the PMOS transistor 109 form another transmission gate.

In the aforementioned configuration, when an "H" signal enters the clock input terminal CLK, the inverter 101 produces an output of "L" and the inverter 102 produces an output of "H". Accordingly, the NMOS transistor 106 and the PMOS transistor 108 come on; and the NMOS transistor 107 and the PMOS transistor 109 goes off. An input received at the terminal IN is transferred to the point A of the memory circuit 110. The data signal received at the point A is inverted by the inverter 103 and transferred to the inverter 105

2 through the point B of the memory circuit 110. The signal is again inverted by the inverter 105 and is output through the output terminal OUT. Thus, data signals received at the data input terminal IN are transferred to the output terminal OUT intact as long as the clock terminal CLK is in the "H" level.

When an "L" signal enters into the clock input terminal CLK, the inverter 101 produces an "H" output and the inverter 102 produces an "L" output. Accordingly, the NMOS transistor 106 and the PMOS transistor 108 go off; and the NMOS transistor 107 and the PMOS transistor 109 come on. The memory circuit 110 maintains the data signal levels at the points A and B. The data signal levels held at the trailing edge of the clock signal received at the clock input CLK terminal are stored in the memory circuit 110 while the clock signal is "L". Even if a new signal is received at the data input terminal IN, the output through the data output terminal OUT does not change as long as the clock signal is "L".

In a case in which the latch circuit 100 is used as a sense latch of a sense amplifier of a memory, a desired memory cell of a memory cell array is designated with word lines and the stored data of the memory cell is transferred to the data input terminal IN of the latch circuit 100 through bit lines, data lines, and the sense amplifier. As described above, a conventional latch circuit 100 holds data at the trailing edge of a clock signal. Therefore, when the latch circuit is used as a sense latch, the data to be stored in the latch circuit 100 or the data to be read from the desired memory cell must exist at the data input terminal IN before the clock signal starts to fall.

It takes a time for the data stored in the desired memory cell to be transferred to the data input terminal IN of the latch circuit 100 through bit lines, data lines, and the sense amplifier after the word lines for designating the memory address are selected on the rise of the clock signal. Let the time required for this process be t1 and the duration of the clock signal at the "H" level be th. Then the relation, th>t1, must hold and special attention must be paid to the timing design so that the inequality relation is satisfied. The timing design is complex. For example, in a fast operation with a short cycle time or in an operation with a large memory capacity, the duty cycle of the clock signal must be larger than 50%, which makes the timing design particularly difficult.

SUMMARY OF THE INVENTION

The object of the present invention, therefore, is to solve the aforementioned problem and to provide a latch circuit that operates properly regardless of the timing of change in the level of the clock signal.

The present invention relates to a latch circuit operating in synchronization with clock signals.

The latch circuit of the present invention comprises (a) a memory unit including a first inverter and a second inverter, the output terminal of the first inverter being connected to the input terminal of the second inverter and the output terminal of the second inverter being connected to the input terminal of the first inverter, (b) a first switching unit, comprising a MOS transistor, for example, which couples the input terminal of the first inverter with the ground, (c) a second switching unit and a third switching unit, each comprising a MOS transistor, for example, which are connected together in series between the ground and the input terminal of the second inverter of the memory unit, (d) a first control unit for controlling the first switching unit according to binary data signals received from outside, (e) a second control unit for controlling the second switching unit according to data signals, (f) a delay unit for transmitting, with delay, the signal level at the input terminal of the second inverter of the memory unit, and (g) a third control unit for controlling the third switching unit according to both the clock signals received from outside and the signal levels transmitted through the delay unit.

More specifically, the second control unit controls the second switching unit according to the external data signals so that the second switching unit operates in a complementary way to the first switching unit. The memory unit holds the level of the data signal written therein when both the first and third switching units are off. Further, the third control unit comprises a two-input AND circuit and turns on the third switching unit when the levels of both the two inputs of the AND circuit are "H", that is, when both the clock signal received from outside and the signal transferred through the delay circuit have "H" levels.

The present invention also provides a latch circuit, operating in synchronization with clock signals, comprising (a) a memory unit including a first inverter and a second inverter, the output terminal of the first inverter being connected to the input terminal of the second inverter and the output terminal of the second inverter being connected to the input terminal of the first inverter, (b) a first switching unit, comprising a MOS transistor, for example, which couples the input terminal of the first inverter of the memory unit with the ground, (c) a second switching unit, comprising a MOS transistor, for example, which is connected between the ground and the input terminal of the second inverter of the memory unit, (d) a first control unit for controlling the first switching unit according to binary data signals received from outside, (e) a delay unit for transmitting, with delay, the signal level at the input terminal of the second inverter of the memory unit, and (f) a second control unit for controlling the second switching unit according to the data signals from outside, the clock signals also received from outside, and the signal levels transmitted through delay unit.

More specifically, the second control unit turns off the second switching unit when the first switching unit is on. The memory unit holds the level of the data signal written therein when both the first and second switching units are off. Further, the second control unit comprises a three-input AND circuit and turns on the second switching unit when the level of each input terminal of the AND circuit is "H", that is, when the data signal from outside, the clock signal received also from outside, and the signal level transmitted through the delay unit are all "H".

The aforementioned latch circuit may further comprise a fourth switching unit connected between the input terminal of the second inverter and the power supply, and a fourth control unit for controlling the fourth switching unit according to the binary data signals received from outside. The fourth control unit controls the fourth switching unit, comprising a MOS transistor, for example, so that the fourth switching unit operates, according to the data signals received from outside, in the same way as the first switching unit does.

The present invention further provides a latch circuit, operating in synchronization with clock signals, comprising (a) a memory unit including a first inverter and a second inverter, the output terminal of the first inverter being connected to the input terminal of the second inverter and the output terminal of the second inverter being connected to the input terminal of the first inverter, (b) a first switching unit, comprising a MOS transistor, for example, which couples the input terminal of the second inverter with the power supply, (c) a second switching unit, comprising a MOS transistor, for example, which is connected between the ground and the input terminal of the first inverter of the memory unit; (d) a first control unit for controlling the first switching unit according to binary data signals received from outside, (e) a delay unit for transmitting, with delay, the signal level at the input terminal of the second inverter of the memory unit, and (f) a second control unit for controlling the second switching unit according to the data signals from outside, the clock signals also received from outside, and the signal levels transmitted through the delay unit.

More specifically, the second control unit turns off the second switching unit when the first switching unit is on. The memory unit holds the level of the data signal written therein when both the first and second switching units are off. Further, the second control unit comprises a three-input AND circuit and turns on the second switching unit when the level of each input terminal of the AND circuit is "H", that is, when the data signal from outside, the clock signal from outside, and the signal level transmitted through the delay unit are all "H".

The input terminal of the delay circuit of the aforementioned latch circuit may be connected to the output terminal of the second inverter of the memory unit through at least one inverter.

The present invention further provides a latch circuit, operating in synchronization with clock signals, comprising (a) a memory unit including an inverter, a first switching unit, comprising, for example, a plurality of MOS transistors connected in series, which is connected between the input terminal of the inverter and the power supply, and a second switching unit, comprising for example, a plurality of MOS transistors connected in series, which is connected between the output terminal of the inverter and the ground, (b) a third switching unit, comprising a MOS transistor, for example, which is connected between the input terminal of the inverter and the power supply, (c) a fourth switching unit, comprising a MOS transistor, for example, which is connected between the input terminal of the inverter and the ground, (d) a first control unit for controlling the third switching unit according to binary data signals received from outside, (e) a delay unit for transmitting, with delay, the signal level at the input terminal of the inverter of the memory unit, and (f) a second control unit for controlling the fourth switching unit according to the data signals from outside, the clock signals from outside, and the signal levels transmitted through the delay unit. The first switching unit operates according to the signal level of the output terminal of the inverter and the output control signal level produced by the second control unit. The second switching unit operates according to the signal level of the output terminal of the inverter and the output control signal level produced by the first control unit.

More specifically, the first switching unit is off when the fourth switching unit is on, while the second switching unit is off when the third switching unit is on, the second switching unit operating in a complementary way to the first switching unit. The first control unit turns off the third switching unit when the fourth switching unit is on, while the second control unit turns off the fourth switching unit when the third switching unit is on. The memory unit holds the level of the data signal written therein when both the third and fourth switching units are off. Further, the second control unit comprises a three-input AND circuit and turns on the fourth switching unit when the level of each input terminal of the AND circuit is "H", that is, when the data signal from outside, the clock signal from outside, and the signal level transmitted through the delay unit are all "H". Alternatively the input terminal of the delay circuit may be connected to the output terminal of the inverter of the memory unit through at least one inverter.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENT

The embodiments of the present invention will be described in detail with reference to the accompanying drawings.

Embodiment 1

Figure 1:
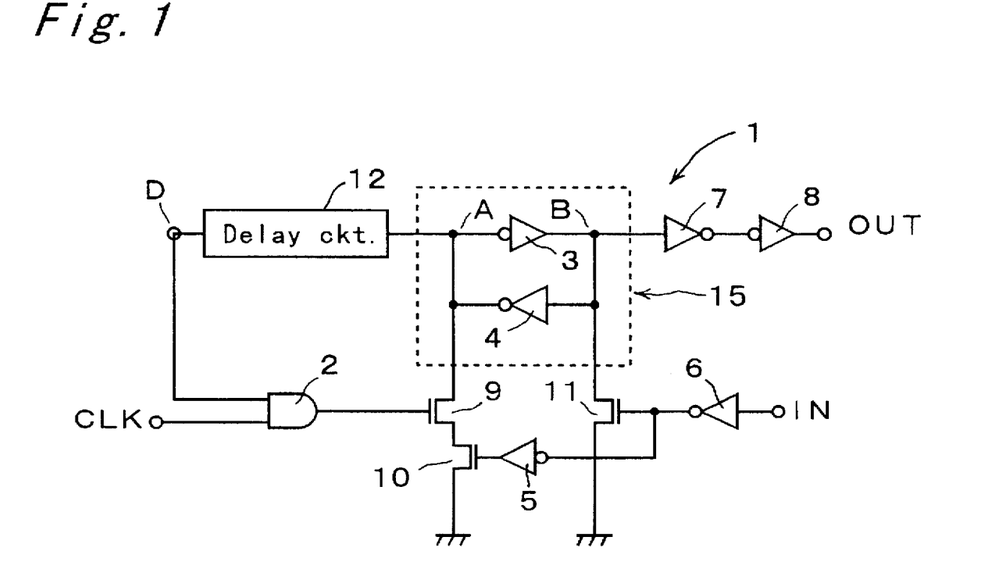
FIG. 1 is the circuit diagram of a latch circuit of Embodiment 1 of the present invention.

FIG. 1 is a circuit diagram of the latch circuit of Embodiment 1 of the present invention. Latch circuit 1 in FIG. 1 comprises a two-input AND circuit 2, six inverters 3, 4, 5, 6, 7, and 8, three NMOS transistors 9, 10, and 11, and a delay circuit 12. The delay circuit 12 is formed, for example, of a plurality of inverters in series so that the input signal is not inverted, or with an extended patterned wiring for producing a larger capacitance.

In FIG. 1, the inverters 4 and 3 function as the first and second inverters in claim 1. The memory circuit 15 forms the memory unit of claim 1. Also the NMOS transistor 11 functions as the first switching unit of claim 1; the NMOS transistor 10, the second switching unit of claim 1; the NMOS transistor 9, the third switching unit of claim 1; the inverter 6, the first control unit of claim 1; the inverters 5 and 6, the second control unit of claim 1; the AND circuit 2, the third control unit of claim 1; and the delay circuit 12, the delay unit of claim 1.

The output terminal of the inverter 3 is connected to the input terminal of the inverter 4, and the output terminal of the inverter 4, in turn, is connected to the input terminal of the inverter 4. The inverters 3 and 4 form a memory circuit 15. The drain of the NMOS transistor 9 and the input terminal of the delay circuit 12 are connected together to the connection point of the input terminal of the inverter 3 and the output terminal of the inverter 4. The drain of the NMOS transistor 10 is connected to the source of the NMOS transistor 9, and the source of the NMOS transistor 10 is grounded. The output terminal of the delay circuit 12 is connected to one of the input terminals of the AND circuit 2. The other terminal of the AND circuit 2 is connected to the clock input terminal CLK which receives the external clock signal. The output terminal of the AND circuit 2 is connected to the gate of the NMOS transistor 9.

The drain of the NMOS transistor 11 is connected to the connection point of the output terminal of the inverter 3 and the input terminal of the inverter 4 and the source of the NMOS transistor 11 is grounded. The gate of the NMOS transistor 11 is connected to the input terminal of the inverter 5 and the output terminal of the inverter 6. The output terminal of the inverter 5 is connected to the gate of the NMOS transistor 10. The input terminal of the inverter 6 is connected to the data input terminal IN of the latch circuit 1 which receives external data signals.

Further, the inverters 7 and 8 are connected in series forming a series circuit. The input terminal of the inverter 7 is connected to the connection point of the output terminal of the inverter 3 and the input terminal of the inverter 4. The output terminal of the inverter 8 is connected to the data output terminal OUT of the latch circuit 1. The connection point of the input terminal of the inverter 3 and the output terminal of the inverter 4 is referred to as the point A; the connection point of the output terminal of the inverter 3 and the input terminal of the inverter 4, the point B; and the output terminal of the delay circuit 12, the point D.

Figure 2:
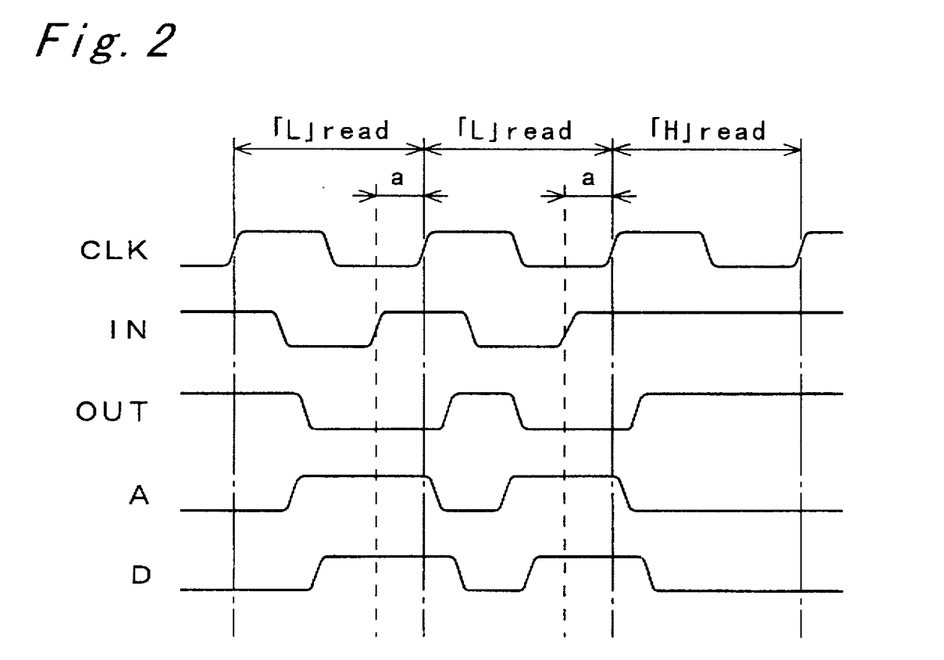
FIG. 2 is the timing chart of the latch circuit 1 as shown in FIG. 1.

FIG. 2 is a timing chart of the latch circuit 1 as shown in FIG. 1. The operations of the latch circuit 1 will be described in detail with reference to FIGS. 1 and 2. First, we explain the operation in which the memory circuit 15 resets its stored data on the rise of the clock signal. The data input terminal IN is set at "H" by a precharger circuit (not shown) as an initial state. Accordingly, the output terminals of the inverters 6 and 5 are set at "L" and "H" respectively. Then the NMOS transistor 11 is off while the NMOS transistor 10 is on.

When the clock signal received at the CLK terminal is "L", the output of the AND circuit 2 is always "L" regardless of the levels of the point D or the point A. Thus the NMOS transistor 9 is off. Therefore, the memory circuit 15 does not have a path to connect itself to the ground and hence holds the initial data. Accordingly the data output terminal OUT has the same level as the initial data stored in the memory circuit.

Now the clock signal level changes from "L" to "H". In a case in which the level of the point A is "L", the output level of the AND circuit 2 remains "L" and the level of the point B remains "H". Accordingly the level of the data output OUT remains "H". In a case in which the level of the point A is "H", on the other hand, the output level of the AND circuit 2 changes from "L" to "H". Then the NMOS transistor 9 comes on. Since the NMOS transistor 10 is already on, the point A is grounded through the NMOS transistors 9 and 10 and the level of the point A becomes "L", which sets the level of the point B to "H".

The change in the level of the point A causes the level of the point D to change from "H" to "L", which, in turn, changes the level of the output of the AND circuit 2 from "H" to "L". Therefore, the NMOS transistor 9 is turned off, the memory circuit 15 holds the data, and the data output from the OUT terminal is reset to "H". This completes the reset operation.

Next, the data latch operation will be described. After the completion of the reset operation, the level of the signal input to the data input terminal IN changes depending upon the data of the memory cell to be read. When "H" level data is read from the memory cell, the latch circuit 1 does nothing and the "H" level data is output from the data output terminal OUT. When "L" data is read from the memory cell, the level of the signal provided to the data input terminal IN is switched from "H" to "L". Then the NMOS transistor 10 goes off and the NMOS transistor 11 comes on. Accordingly, the point B is grounded through the NMOS transistor 11. Therefore the levels of the points B and A become "L" and "H" respectively and the levels of those points become stable. The output from the data output terminal OUT changes from "H" to "L".

In this case, even if the NMOS transistor 9 comes on, the point A of the memory circuit 15 will not be grounded because the NMOS transistor 10 is switched off as the level of the data input terminal IN changes from "H" to "L". Therefore, the level of the signal sent from the data output terminal OUT is the same regardless of the levels of the clock signal received at the CLK. When the signal level entering the data input terminal IN changes from "H" to "L", the level of the point A changes from "L" to "H" and the levels of the point B, as well as the data output terminal OUT, change from "H" to "L". After the change these levels are latched.

After the data latched in the memory circuit 15 is output from the data output terminal OUT, the precharger circuit switches the level of the data input terminal IN to "H". The latch circuit 1 performs the reset operation and the output is reset. The timing is shown as "a" in FIG. 2. The delay circuit 12 must delay the signal transmission long enough so that the "H" level of the point A of the memory circuit 15 completely changes to the "L" level. The delay time of the delay circuit 12 must be set to ensure that transition. The time required to complete the operation of the latch circuit 1 can be adjusted only with the delay time of the delay circuit 12. Hence one does not have to be concerned about other timings.

As described above the fall of the clock signal entering the CLK terminal can take place before or after the level of the signal entering the data input terminal IN changes. Therefore, the only condition to be considered is that the duration of the "H" level of the clock signal should be longer than the time required for the memory circuit 15 to be reset. One need not be concerned about the timing of the change in the clock signal level and the timing of the change in the level of the signal entering the data input terminal IN. This not only makes the design of the circuit simple but also allows the common clock signal of a 50% duty cycle to be used.

Embodiment 2

Figure 3:
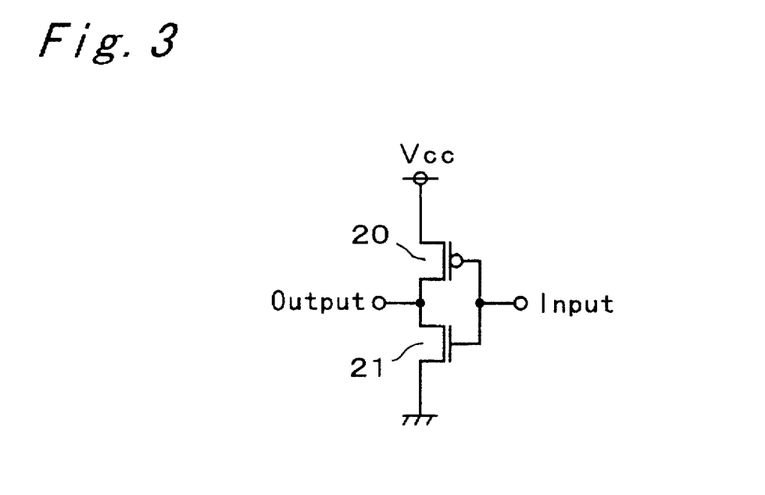
FIG. 3 is the circuit diagram of the inverters used in the latch circuit 1 of Embodiment 1.

FIG. 3 is a circuit diagram of the inverters used in the latch circuit 1 of Embodiment 1. The inverter shown in FIG. 3 comprises a PMOS transistor 20 and an NMOS transistor 21. The power supply voltage Vcc is applied to the source of the PMOS transistor 20. The drain of the PMOS transistor 20 is connected to the drain of the NMOS transistor 21 and the connection point is an output of the inverter. The source of the NMOS transistor 21 is grounded. The gates of the PMOS transistor 20 and the NMOS transistor 21 are connected to form an input of the inverter.

For example, when the level of the point A of the memory circuit 15 changes from "L" to "H", the PMOS transistor 20 of the inverter 4 comes on and the NMOS transistor 21 goes off thus causing the output level of the inverter 4 to change to "H". In order to make this transition at the point A more stable and faster, one may use the PMOS transistor 20, which has a narrower gate width so that its "on" resistance is large, together with a MOS transistor, which has a wider gate width so that its "on" resistance is small. The latch circuit using these kind of inverters is referred to as Embodiment 2.

Figure 4:
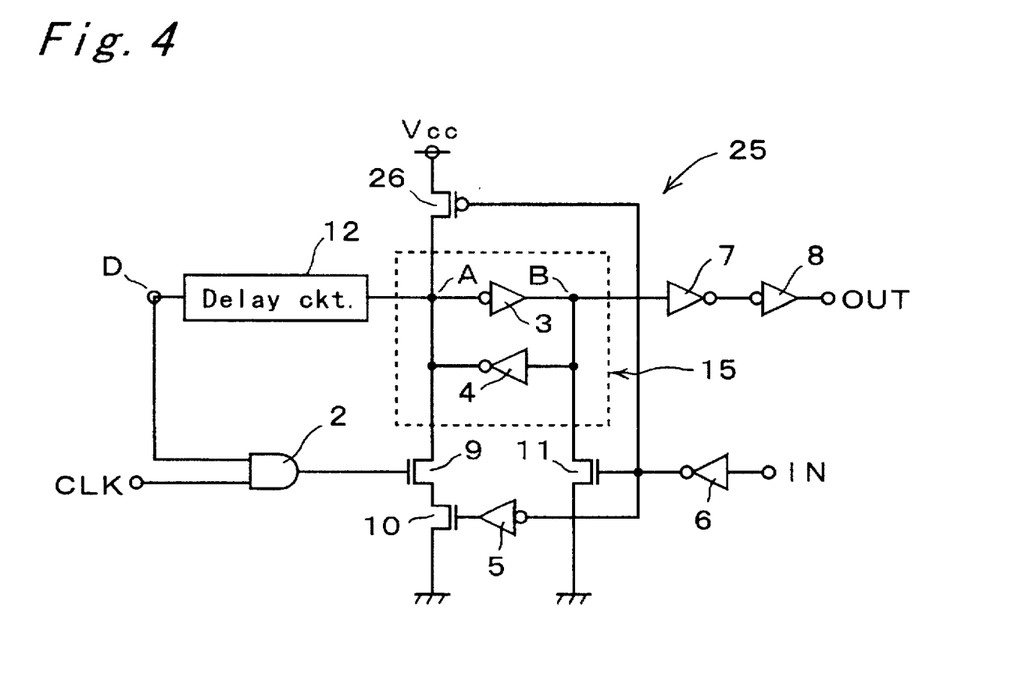
FIG. 4 is the circuit diagram of a latch circuit of Embodiment 2 of the present invention.

FIG. 4 is a circuit diagram of a latch circuit 25 of Embodiment 2 of the present invention. The like reference numerals of FIGS. 1 and 4 indicate identical or functionally similar elements. Thus an explanation of those elements will not be repeated and only the differences with FIG. 1 will be described below.

The latch circuit 25 in FIG. 4 is obtained by adding a PMOS transistor 26 to the latch circuit 1 of FIG. 1. Referring to FIG. 4, the drain of the PMOS transistor 26 is connected to the point A of the memory circuit 15 and the gate of the PMOS transistor 26 is connected to the output terminal of the inverter 6. The power supply voltage Vcc is applied to the source of the PMOS transistor 26. The PMOS transistor 26 forms the fourth switch of claim 10 and the inverter 6 forms the fourth control unit of claim 10.

In this configuration, when the level of the point A of the memory circuit 15 is switched from "L" to "H", that is, when data is written to the memory circuit 15, the PMOS transistor 26 as well as the PMOS transistor 20 of the inverter 4 come on. This configuration, therefore, makes the transition of the point A from "L" to "H" or the transition of the point B from "H" to "L" more stable and faster thus improving the performance of the write operation to the memory circuit 15.

Embodiment 3

Figure 5:
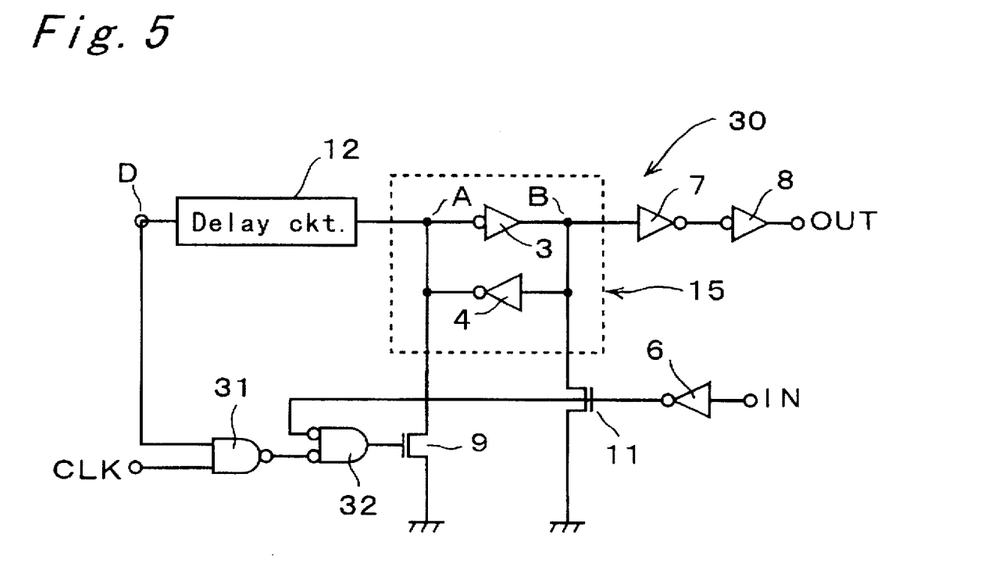
FIG. 5 is the circuit diagram of a latch circuit of Embodiment 3 of the present invention.

FIG. 5 is a circuit diagram of a latch circuit 30 of Embodiment 3 of the present invention. The like reference numerals of FIGS. 1 and 5 indicate identical or functionally similar elements. Thus an explanation of those elements is not given and only the differences with FIG. 1 will be described below.

The latch circuit 30 as shown in FIG. 5 is obtained by removing the AND circuit 2, the inverter 5, and the NMOS transistor 10 from the latch circuit 1 shown in FIG. 1 and by adding a two-input NAND circuit 31 and a two-input NOR circuit 32.

Referring to FIG. 5, the output terminal of the inverter 6 is connected to the gate of the NMOS transistor 11 and also to one of the two input terminals of the NOR circuit 32. The other input terminal of the NOR circuit 32 is connected to the output terminal of the NAND circuit 31. One of the two input terminals of the NAND circuit 31 is connected to the output terminal of the delay circuit 12 while the other input terminal of the NAND circuit 31 is connected to the clock input terminal CLK. Further, the output terminal of the NOR circuit 32 is connected to the gate of the NMOS transistor 9. The drain of the NMOS transistor 9 is connected to the point A of the memory circuit 15 and its source is grounded.

The inverter 6 forms the first control unit of claim 6. The inverter 6, the NAND circuit 31, and the NOR circuit 32 form the second control unit of claim 6. Further, the NMOS transistor 11 forms the first switching unit of claim 6; the NMOS transistor 9, the second switching unit of claim 6; and the memory circuit 15, the memory unit of claim 6.

Now, an operation of the latch circuit 30 will be described below. The timing chart for the latch circuit 30 is the same as that shown in FIG. 2. First, we explain the operation in which the memory circuit 15 resets its stored data on the rise of the clock signal. The data input terminal IN is set to "H" by a precharger circuit (not shown) as an initial state. Accordingly, the level of the output terminal of the inverter 6 is "L" and the NMOS transistor 11 is off.

When the clock signal entering the CLK terminal is "L", the output of the NAND circuit 31 is "H" regardless of the level of the output terminal D of the delay circuit 12 or the level of the terminal A of the memory circuit 15. Thus, the output of the NOR circuit 32 is "L" and hence the NMOS transistor 9 is off. Therefore, the memory circuit 15 does not have a path to connect itself to the ground and therefore holds the initial data. Accordingly the data output terminal OUT has the same level as the initial data stored in the memory circuit.

Now the clock signal level changes from "L" to "H". In a case in which the level of the point A is "L", the output level of the NAND circuit 31 remains "H" and the level of the point B also remains "H". Accordingly the level of the data output OUT remains "H". On the other hand, in a case in which the level of the point A is "H" the output level of the NAND circuit 31 changes from "H" to "L" and the output of the NOR circuit 32 changes from "L" to "H". Then the NMOS transistor 9 comes on. The point A is grounded through the NMOS transistor 9 and the level of the point A becomes "L", which sets the level of the point B to "H".

The change in the level of the point A from "H" to "L" causes the level of the point D to change from "H" to "L", which, in turn, changes the output level of the NAND circuit 31 from "L" to "H". Therefore, the output level of the NOR circuit 32 changes from "H" to "L" and the NMOS transistor 9 is turned off. Therefore memory circuit 15 can hold the data, and the level of the data output terminal OUT is now reset to "H". This completes the reset operation.

Next, the data latch operation will be described. After the completion of the reset operation described above, the level of the signal input to the data input terminal IN changes depending upon the data of the memory cell to be read. When data of an "H" level is read from the memory cell, the latch circuit 30 does nothing and the "H" level data (the reset level) is output from the data output terminal OUT. When data with "L" level is read from the memory cell, the level of the signal provided to the data input terminal IN is switched from "H" to "L". Then the NMOS transistor 11 is turned on. Accordingly the point B of the memory circuit 15 is grounded through the NMOS transistor 11. Therefore the levels of the points B and A become "L" and "H" respectively and the levels of those points become stable. The output level from the data output terminal OUT changes from "H" to "L".

In this case the change in the level of the data input terminal IN from "H" to "L" causes one of the two input terminals of the NOR circuit 32 to become "H" causing the output level of the NOR circuit 32 to become "L". Therefore NMOS transistor 9 goes of f and the point A of the memory circuit 15 will not be grounded. Therefore, the level of the output signal from the data output terminal OUT is the same regardless of the levels of the clock signals received at the CLK. When the signal level entering into the data input terminal IN changes from "H" to "L", the level of the point A changes from "L" to "H" and the levels of the point B as well as the data output terminal OUT change from "H" to "L". After this change these levels are latched.

After the data latched in the memory circuit 15 is output from the data output terminal OUT, the precharger circuit switches the level of the data input terminal IN to "H". The latch circuit 30 performs the reset operation again and the output is reset. The timing is shown as "a" in FIG. 2. The time required to complete the reset operation of the latch circuit 30 can be adjusted only with the delay time of the delay circuit 12. Hence one does not have to be concerned about other timings.

As described above the latch circuit 30 of Embodiment 3 of the present invention provides the same effect as Embodiment 1. Further, the level of the point A of the memory circuit 15 changes its level from "H" to "L" through only one transistor, namely the NMOS transistor 9. Therefore, the transition of the level of the point A of the memory circuit 15 from "H" to "L" and that for the point B from "L" to "H" are faster. That is, the write performance of the circuit 15 has been improved.

Embodiment 4

In the latch circuit 30 of Embodiment 3, as Embodiment 2, when the level of the point A of the memory circuit 15 changes from "L" to "H", the PMOS transistor 20 of the inverter 4 comes on and the NMOS transistor 21 goes off to cause the output level of the inverter 4 to change to "H". In order to make this transition of the point A of Embodiment 3 more stable and faster, one may use the PMOS transistor 20 and the NMOS transistor 21, which have narrower gate widths so that their "on" resistances are larger, together with a MOS transistor, which has a wider gate width so that its "on" resistance is small. The latch circuit using these kinds of inverters is referred to as Embodiment 4.

Figure 6:
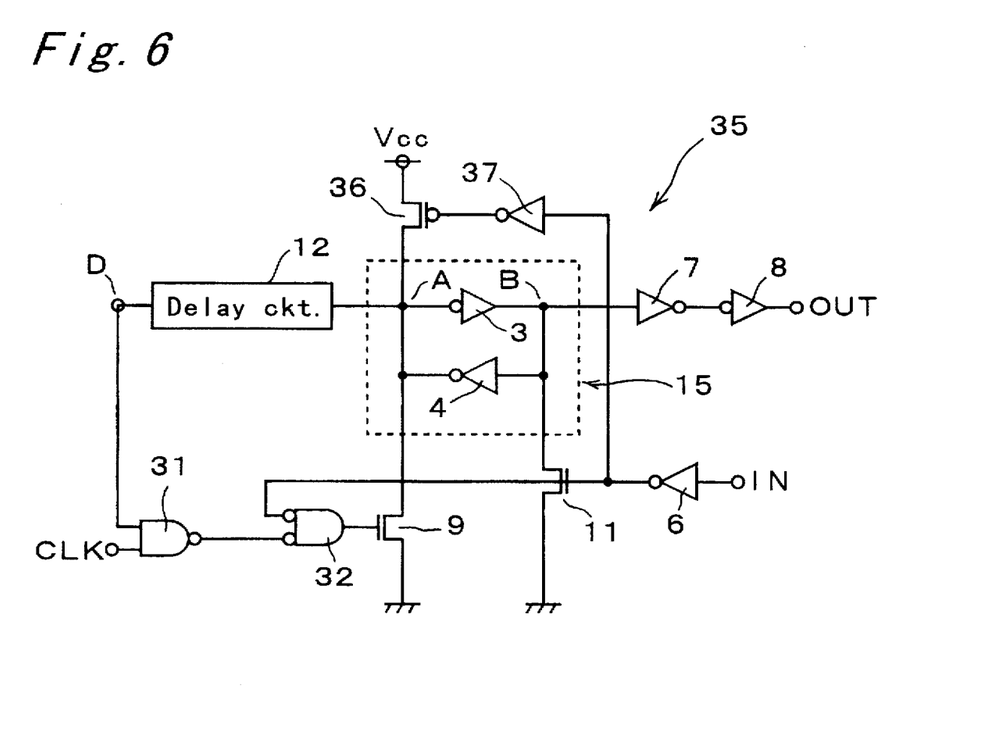
FIG. 6 is the circuit diagram of a latch circuit of Embodiment 4 of the present invention.

FIG. 6 is a circuit diagram of a latch circuit 35 of Embodiment 4 of the present invention. The like reference numerals of FIGS. 5 and 6 indicate identical or functionally similar elements. Thus an explanation of those elements will not be repeated and only the differences with FIG. 5 will be described below.

The latch circuit 35 in FIG. 6 is the same as the latch circuit 35 shown in FIG. 5 except that the latch circuit 35 has an additional PMOS transistor 36 and an inverter 37.

Referring to FIG. 6, the drain of the PMOS transistor 36 is connected to the point A of the memory circuit 15; the gate of the PMOS transistor 36 is connected to the output terminal of the inverter 37; and the input terminal of the inverter 37 is connected to the output terminal of the inverter 6. The power supply voltage Vcc is applied to the source of the PMOS transistor 36. The PMOS transistor 36 forms the fourth switching unit of claim 10 and the inverters 6 and 37 form the fourth control unit of claim 10.

In the circuit as shown in FIG. 6, when the level of the point A of the memory circuit 15 changes from "L" to "H", that is, when the level of the data input terminal IN 5changes from "H" to "L" causing the NMOS transistor 11 to come on, both the PMOS transistor 36 and the PMOS transistor 20 of the inverter 4 are turned on. Therefore, the transition of the level of the point A of the memory circuit 15 from "L" to "H", that is, the transition of the level of the point B from "H" to "L" will be faster. Thus the write performance of the circuit 15 has been improved.

Embodiment 5

Figure 7:
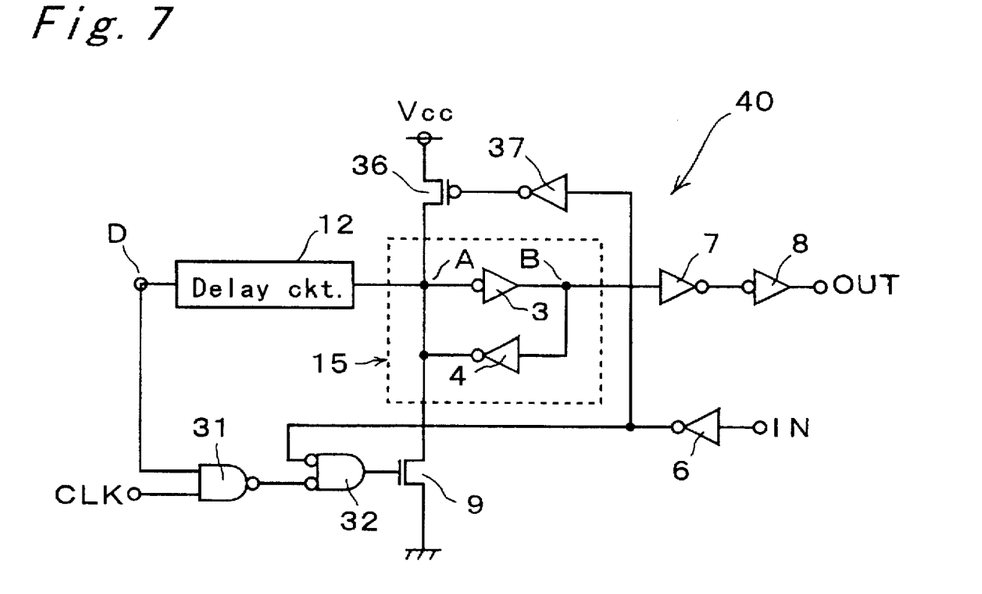
FIG. 7 is the circuit diagram of a latch circuit of Embodiment 5 of the present invention.

Since the latch circuit of Embodiment 4 includes the PMOS transistor 36, the NMOS transistor 11 is not necessarily needed. FIG. 7 is a circuit diagram of a latch circuit 40 of Embodiment 5 which has this modification. The like reference numerals of FIGS. 6 and 7 indicate identical or functionally similar elements. Thus an explanation of those elements will not be repeated and only the differences with FIG. 6 will be described below.

The latch circuit 40 is obtained by removing the NMOS transistor 11 from the latch circuit 35 shown in FIG. 6 and by connecting the output terminal of inverter 6 to one of the input terminals of the NOR circuit 32 and to the input terminal of the inverter 37.

Referring to FIG. 7, the PMOS transistor 36 forms the first switching unit of claim 10 and the NMOS transistor 9 forms the second switching unit of claim 10. Further, the inverters 6 and 37 form the first control unit of claim 10; the inverter 6, the NAND circuit 31, and the NOR circuit 32, the second control unit of claim 10; and the memory circuit 15, the memory unit of claim 10.

Now an operation of the latch circuit 40 will be described below. The timing chart for the latch circuit 40 is the same as that shown in FIG. 2. Since the reset operation is similar to that for the latch circuit 35 in FIG. 6 except that the latch circuit 40 does not include the NMOS transistor 11, the description of the reset operation of the latch circuit 40 will not be given.

Next, the data latch operation of the latch circuit 40 will be described. After the completion of the reset operation, the level of the signal input to the data input terminal IN changes depending upon the data of the memory cell to be read. When data with an "H" level is read from the memory cell, the latch circuit 30 does nothing.

When data with an "L" level is read from the memory cell, the level of the signal provided to the data input terminal IN is switched from "H" to "L". Then the PMOS transistor 36 is turned on. Accordingly, the power supply voltage Vcc is applied to the point A of the memory circuit 15 through the PMOS transistor 36. Therefore the levels of the points A and B become "H" and "L" respectively and the levels of those points become stable. The output level from the data output terminal OUT changes from "H" to "L". Except for this the latch circuit 40 works as the latch circuit 35 in FIG. 6 does and further explanation will not be given.

Thus, the latch circuit 40 of Embodiment 5 has the same structure as the latch circuit 35 except that the latch circuit 40 does not include the NMOS transistor 11 and it works the same way as the latch circuit 35. That is, the latch circuit 40 provides the same effect as the latch circuit 1 of Embodiment 1.

Embodiment 6

Figure 8:
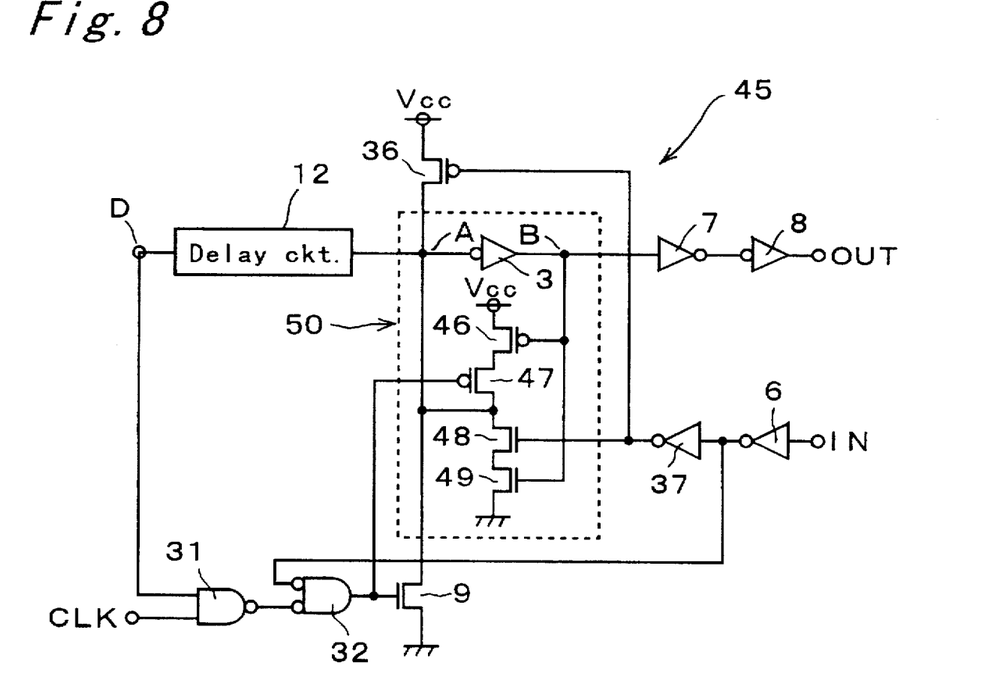
FIG. 8 is the circuit diagram of a latch circuit of Embodiment 6 of the present invention.

FIG. 8 is a circuit diagram of a latch circuit 45 of Embodiment 6. The like reference numerals of FIGS. 7 and 8 indicate identical or functionally similar elements. Thus an explanation of those elements will not be repeated and only the differences with FIG. 7 will be described below.

The latch circuit 45 is obtained by removing the inverter 4 from the latch circuit 40 shown in FIG. 7 and by adding to the latch circuit 40 PMOS transistors 46 and 47 and NMOS transistors 48 and 49. The memory circuit 15 of the latch circuit 40 is now referred to as the memory circuit 50.

Referring to FIG. 8, the memory circuit 50 comprises the inverter 3, the PMOS transistors 46 and 47, and the NMOS transistors 48 and 49. The PMOS transistors 46 and 47 and the NMOS transistors 48 and 49 are connected in series: the drain of the PMOS transistor 46 is connected to the source of the PMOS transistor 47; the drain of the PMOS transistor 47, to the drain of the NMOS transistor 48; and finally the source of the NMOS transistor 48, to the drain of the NMOS transistor 49. Further the power supply voltage Vcc is applied to the source of the PMOS transistor 46 and the source of the NMOS transistor 49 is grounded. The connection point of the drain of the PMOS transistor 47 and the drain of the NMOS transistor 48 is connected to the input terminal of the inverter 3. This connection point is referred to as the point A of the memory circuit 50.

The gates of the PMOS transistor 46 and the NMOS transistor 49 are connected together to the output terminal of the inverter 3. This connection point is referred to as the point B of the memory circuit 50. The gate of the PMOS transistor 47 is connected to the output terminal of the NOR circuit 32 and the gate of the NMOS transistor 48 is connected to the output terminal of the inverter 37. The drain of the PMOS transistor 36, the drain of the NMOS transistor 9, and the input terminal of the delay circuit 12 are connected together to the point A of the memory circuit 50. The input terminal of the inverter 7 is connected to the point B of the memory circuit 50.

The PMOS transistors 46 and 47 form the first switching unit of claim 16 and the NMOS transistors 48 and 49 form the second switching unit of claim 16. The inverter 3 forms the inverter of the memory unit of claim 16 and the memory circuit 50 forms the memory unit of claim 16. Further, the PMOS transistor 36 forms the third switching unit of claim 16; the NMOS transistor 9, the fourth switching unit of claim 10; the inverters 6 and 37, the first control unit of claim 16; and the inverter 6, the NAND circuit 31, and the NOR circuit 32, the second control unit of claim 16.

Now, an operation of the latch circuit 45 shown in FIG. 8 will be described below. The timing chart for the latch circuit 45 is the same as that shown in FIG. 2.

First, we explain the operation in which the memory circuit 50 resets its stored data on the rise of the clock signal. The data input terminal IN is set to "H" by a precharger circuit (not shown) as an initial state. Accordingly, the level of the output terminal of the inverter 37 is "H" causing the PMOS transistor 36 to be off and the NMOS transistor 48 to be on.

When the level of the point A of the memory circuit 50 is "L", the level of the point B is "H", which causes the PMOS transistor 46 to be off and the NMOS transistor 49 to be on. Since the level of the output terminal D of the delay circuit 12 is the same as that of the point A, the level of one of the input terminals of the NAND circuit 31 is "L" and hence the level of its output is "H" regardless of the level of the clock signal. Therefore, the output level of the NOR circuit 32 is "L", which causes the NMOS transistor 9 to be off and the PMOS transistor 47 to be on. Thus, the NMOS transistor 9 and the PMOS transistors 36 and 46 are off, and the PMOS transistor 47 and the NMOS transistors 48 and 49 are on. Therefore, the point A remains at "L" level and the memory circuit 50 can hold the initial data.

Next, when the data input terminal IN is set to "H" as the initial state and when the level of the point A of the memory circuit 50 is "H", the level of the point B is "L", which causes the PMOS transistor 46 to be on and the NMOS transistor 49 to be off. The level of the output terminal D of the delay circuit 12 is the same as the level of the point A of the memory circuit 50. Accordingly one of the input terminals of the NAND circuit 31 is "H". The other input terminal of the NAND circuit 31 is fed with the clock signal. If the level of the clock signal is "L", the output level of the NOR circuit 32 is "L" and the NMOS transistor 9 is off while the PMOS transistor 47 is on. Thus the NMOS transistors 9 and 49 and the PMOS transistors 36 are off while the PMOS transistors 46 and 47 are on. Hence the level of the point A does not change.

Now, when the clock signal changes from "L" to "H", the output level of the NAND circuit 31 becomes "L" and the output level of the NOR circuit 32 becomes "H", which causes the NMOS transistor 9 to be on and the PMOS transistor 47 to be off. Thus, the NMOS transistors 9 and 48 and the PMOS transistor 46 are on while the PMOS transistors 36 and 47 and the NMOS transistor 49 are off. The point A of the memory circuit 50 is grounded through the NMOS transistor 9 and its level changes from "H" to "L". Accordingly the level of the point B changes to "H" causing the PMOS transistor 46 to be off and the NMOS transistor 49 to be on and the system is stabilized.

The change in the level of the point A from "H" to "L" causes the level of the point D to change from "H" to "L".

Accordingly the output level of the NAND circuit 31 changes to "H" and remains there regardless of the level of the clock signal. Therefore, the output level of the NOR circuit 32 changes from "H" to "L", the NMOS transistor 9 is turned off, and PMOS transistor 47 is turned on. That is, the NMOS transistor 9 and the PMOS transistors 36 and 46 are off, and the PMOS transistor 47 and the NMOS transistors 48 and 49 are on, which stabilizes the memory circuit 50 and lets it hold the data. The output level of the data output terminal OUT is now reset to "H". This completes the reset operation.

Next, the data latch operation will be described. After the completion of the reset operation described above, the level of the signal input to the data input terminal IN changes depending upon the data of the memory cell to be read. When data of an "H" level is read from the memory cell, the latch circuit 30 does nothing and the "H" level data (the reset level) is output from the data output terminal OUT.

When data of an "L" level is read from the memory cell after the completion of the reset operation described above, the signal level entering the data input terminal IN changes from "H" to "L". Then, PMOS transistor 36 is turned on and the NMOS transistor 48 is turned off. At the same time, the level of one of the two terminals of the NOR circuit 32 changes to "H", causing its output level to be "L" regardless of the level of the other terminal, that is, the level of the output terminal D of the delay circuit 12 and the level of the clock signal. Now, the NMOS transistor 9 remains off and the PMOS transistor 47 is on. Thus, the NMOS transistors 9 and 48 and the PMOS transistor 46 are off, and the PMOS transistors 36 and 47 and the NMOS transistors 49 are on. The level of the points A and B of the memory circuit 50 becomes "H" and "L" respectively, and the level of the data output terminal OUT changes from "H" to "L".

In this case, the change in the level of the data input terminal IN from "H" to "L" causes one of the two input terminals of the NOR circuit 32 to become "H" causing the output level of the NOR circuit 32 to become "L". Therefore the NMOS transistor 9 goes off and the point A of the memory circuit 50 will not be grounded. Therefore, the level of the output signal from the data output terminal OUT is the same regardless of the levels of the clock signals received at the CLK. When the signal level entering the data input terminal IN changes from "H" to "L", the level of the point A changes from "L" to "H" and the level of the point B as well as the level of the data output terminal OUT change from "H" to "L". After this change these levels are latched.

After the data latched in the memory circuit 50 is output from the data output terminal OUT, the precharger circuit switches the level of the data input terminal IN to "H". The latch circuit 45 performs the reset operation again and the output is reset. The timing is shown as "a" in FIG. 2. The time required to complete the reset operation of the latch circuit 45 can be adjusted only with the delay time of the delay circuit 12. Hence one does not have to be concerned about other timings.

As described above the latch circuit 45 of Embodiment 6 of the present invention provides the same effect as Embodiment 1. Further, the NMOS transistor 9 and the PMOS transistor 47 will not be on at the same time. Nor will the PMOS transistor 36 and the NMOS transistor 48 be on at the same time. Nor will the NMOS transistor 9 and the PMOS transistor 36 be on. Therefore, when the PMOS transistor 36 is on, the point A is assured to be disconnected to the ground, and when the NMOS transistor 9 is on, the point A is assured to be cut off from the power supply voltage Vcc. Thus, the level of the point A and the level of the point B are switched more securely and faster from "H" to "L" and from "L" to "H" respectively.

Embodiment 7

The input of the delay circuit 12 of each latch circuit of Embodiment 1–6 is connected to the input terminal of the inverter 3 or to the point A of the memory circuit. However, the input of the delay circuit 12 may be connected to the connection point of the output terminal of the inverter 7 and the input terminal of the inverter 8. Embodiment 7 of the present invention is a latch circuit with this structure.

Figure 9:
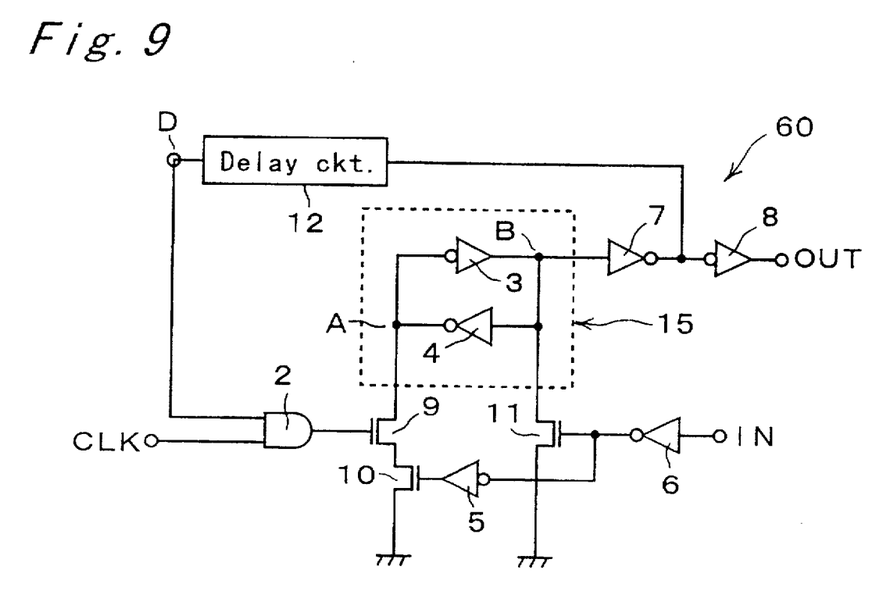
FIG. 9 is the circuit diagram of a latch circuit of Embodiment 7 of the present invention.

FIG. 9 is a circuit diagram of a latch circuit 60 of Embodiment 7 of the present invention. The like reference numerals of FIGS. 9 and 1 indicate identical or functionally similar elements. Thus an explanation of those elements will not be repeated and only the differences with FIG. 1 will be described below.

The difference between FIG. 9 and FIG. 1 is that the input of the delay circuit 12 is connected to the connection point of the output terminal of the inverter 7 and the input terminal of the inverter 8 instead of to the connection point of the input terminal of the inverter 3 and the output terminal of the inverter 4. Although the present embodiment has been described based on Embodiment 1 shown in FIG. 1, the present embodiment includes Embodiments 2–6 modified by changing the connection points of the input of the delay circuit in a similar way as described above.

The operation of the latch circuit 60 differs from that of latch circuit 1 in that the delay circuit 12 of the latch circuit 1 receives the change in the level of the point A directly while the delay circuit 12 of the latch circuit 60 receives the change through the inverters 3 and 7.

Thus, the delay time of the latch circuit 1 is determined only by the delay circuit 12, whereas the delay time of the latch circuit 60 is determined by the inverters 3 and 7 as well as by the delay circuit 12, which makes the delay operation more reliable. Further, this allows the delay time of the delay circuit to be shorter, which may reduce the number of inverters used therein and may shorten its patterned wiring so that the area of the print circuit board occupied by the wiring is reduced. This will reduce the production cost of the delay circuit 12.

As described above a latch circuit of the present invention comprises a memory unit including a first inverter and a second inverter, the output terminal of the first inverter being connected to the input terminal of the second inverter and the output terminal of the second inverter being connected to the input terminal of the first inverter. The input terminal of the first inverter is grounded through a first switching unit comprising, for example, an NMOS transistor. The input terminal of the second inverter is also grounded through a second switching unit and a third switching unit, connected together in series, each comprising, for example, a MOS transistor. The first switching unit and the second switching unit operate in a complementary way according to the binary data signals received from outside. The third switching unit operates according to both the clock signals received from outside and the signal levels transmitted through the delay unit.

More specifically, the second switching unit is controlled so that it operates in a complementary way to the first switching unit according to the binary data signals received from outside. The memory unit holds the level of the data signal written therein when both the first and third switching units are off. Further, the third control unit is controlled by a two-input AND circuit and turns on the third switching unit when the levels of both the two inputs of the AND circuit are "H", that is, when both the clock signal received from outside and the signal transferred through the delay circuit have "H" levels.

Thus, the external clock signal may change its level before or after the external binary data signal changes its level. Therefore, one need not be concerned about the timing of the change of the clock signal level with regard to the timing of the change of the level of the data signal. This not only makes the circuit design simple but also allows the common clock signals of a 50% duty cycle to be used.

Another latch circuit of the present invention may comprise a memory unit including a first inverter and a second inverter, the output terminal of the first inverter being connected to the input terminal of the second inverter and the output terminal of the second inverter being connected to the input terminal of the first inverter. The input terminal of the first inverter is grounded through a first switching unit comprising, for example, an NMOS transistor. The input terminal of the second inverter is also grounded through a second switching unit comprising, for example, an NMOS transistor. The first switching unit operates according to the binary data signals received from outside, and the second switching unit operates according to the data signals, the clock signals received from outside, and the signal levels transmitted through the delay unit.

More specifically, the second switching unit is off when the first switching unit is on. The memory unit holds the level of the data signal written therein when both the first and second switching units are off. Further, a three-input AND circuit controls the second switching unit and turns on the second switching unit when the level of each input terminal of the AND circuit is "H", that is, when the data signal from outside, the clock signal received also from outside, and the signal level transmitted through the delay unit are all "H".

Thus, one need not be concerned about the timing of the change of the clock signal level with regard to the timing of the change of the level of the data signal. This makes the circuit design simple. In this configuration the level of the input terminal of the second inverter is changed from "H" to "L" by the second switching unit only, not by two switching units connected together in series. Therefore, the transition of the level of the input terminal of the second inverter from "H" to "L" and that for the input terminal of the first inverter from "L" to "H" become faster. That is, the write performance to the memory unit is improved.

The aforementioned latch circuit may include a fourth switching unit, comprising, for example, an NMOS transistor through which the input terminal of the second inverter is connected to the power supply. The fourth switching unit is controlled by the data signal received from outside. More specifically the fourth switching unit operates as the first switching unit does and turns on when the input terminal of the first inverter changes its level from "L" to "H".

Therefore, the transition of the level of the input terminal of the first inverter of the memory unit from "L" to "H", that is, the transition of the level of the input terminal of the second inverter from "H" to "L", will be faster. Thus the write performance of the memory unit is improved.

Yet another latch circuit of the present invention may comprise a memory unit including a first inverter and a second inverter, the output terminal of the first inverter being connected to the input terminal of the second inverter and the output terminal of the second inverter being connected to the input terminal of the first inverter. The input terminal of the first inverter is connected to the power supply through a first switching unit comprising an NMOS transistor, for example, and it is grounded through a second switching unit comprising, for example, an NMOS transistor. The first switching unit operates according to the binary data signals received from outside, and the second switching unit operates according to the data signals, the clock signals from outside, and the signal levels transmitted through the delay unit.

More specifically, the second switching unit is off when the first switching unit is on. The memory unit holds the level of the data signal written therein when both the first and second switching units are off. Further, a three-input AND circuit controls the second switching unit and turns on the second switching unit when the level of each input terminal of the AND circuit is "H", that is, when the data signal from outside, the clock signal from outside, and the signal level transmitted through the delay unit are all "H".

Thus, the external clock signal may change its level before or after the external binary data signal changes its level. Therefore, one need not be concerned about the timing of the change of the clock signal level with regard to the timing of the change of the level of the data signal. This not only makes the circuit design simple but also allows the common clock signals of a 50% duty cycle to be used.

The input terminal of the delay circuit of each of the aforementioned latch circuits may be connected to the output terminal of the second inverter of the memory unit through at least one inverter. Thus, the delay time of the latch circuit is the sum of the delay time of the delay unit, the delay time of the second inverter of the memory unit, and the delay time of the inverter placed between the output terminal of the second inverter and the input of the delay unit. This allows the delay time of the delay unit to be shorter, which may reduce the number of inverters used in the delay unit and may shorten its patterned wiring so that the area of the print circuit board occupied by the wiring is reduced. This will reduce the production cost of the delay unit.

Still another latch circuit of the present invention comprises a memory unit including an inverter; a first switching unit comprising, for example, a plurality of MOS transistors connected in series, which is connected between the input terminal of the inverter and the power supply; and a second switching unit comprising, for example, a plurality of MOS transistors connected in series, which is connected between the output terminal of the inverter and the ground. It also comprises a third switching unit comprising, for example, a MOS transistor, which is connected between the input terminal of the inverter and the power supply; and a fourth switching unit comprising, for example, a MOS transistor, which is connected between the input terminal of the inverter and the ground. The first switching unit operates according to the signal level of the output terminal of the inverter and the output control signal level produced by the second control unit. The second switching unit operates according to the signal level of the output terminal of the inverter and the output control signal level produced by the first control unit. The third switching unit operates according to the data signals received from outside. The fourth switching unit operates according to the data signals, the clock signals from outside, and the level of the signal transmitted through the delay unit.

More specifically, the first switching unit is off when the fourth switching unit is on whereas the second switching unit is off when the third switching unit is on, the second switching unit operating in a complementary way to the first switching unit. The third switching unit is turned off when the fourth switching unit is on while the fourth switching unit is turned off when the third switching unit is on. The memory unit holds the level of the data signal written therein when both the third and fourth switching units are off. A three-input AND circuit controls the fourth switching unit and turns it on when the level of each input terminal of the AND circuit is "H", that is, when the data signal from outside, the clock signal received also from outside, and the signal level transmitted through the delay unit are all "H".

Thus, one need not be concerned about the timing of the change of the clock signal level and the timing of the change of the level of the data signal. This makes the circuit design simple. Further, the first switching unit and the fourth switching unit will not be on at the same time. Nor will the second switching unit and the third switching unit be on at the same time. Nor will the third switching unit and the fourth switching unit be on at the same time. Therefore, when the third switching unit is on, the input terminal of the inverter of the memory unit is assured to be disconnected to the ground, and when the fourth switching unit is on, the input terminal of the inverter is assured to be cut off from the power supply voltage Vcc. Thus, the levels of the input and output terminals of the inverter of the memory unit are switched more securely and faster from "L" to "H" and from "H" to "L" respectively.

Further, the input terminal of the delay unit of the above latch circuit may be connected to the output terminal of the inverter of the memory unit through at least one inverter. Thus, the delay time of the latch circuit is the sum of the delay times of the delay unit, the inverter of the memory unit, and the inverter placed between the output terminal of the inverter of the memory unit and the input of the delay unit. This allows the delay time of the delay unit to be shorter, which may reduce the number of inverters used in the delay unit and may shorten its patterned wiring so that the area of the print circuit board occupied by the wiring is reduced. This will reduce the production cost of the delay unit.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A latch circuit operating in synchronization with clock signals comprising:
   a memory unit including a first inverter and a second inverter, the output terminal of said first inverter being connected to the input terminal of said second inverter and the output terminal of said second inverter being connected to the input terminal of said first inverter;
   a first switching unit coupling the input terminal of said first inverter with the ground;
   a second switching unit and a third switching unit connected together in series between the ground and the input terminal of said second inverter of said memory unit;
   a first control unit for controlling said first switching unit according to binary data signals received from outside;
   a second control unit for controlling said second switching unit according to said data signals;
   a delay unit for transmitting, with delay, the signal level at the input terminal of said second inverter of said memory unit; and
   a third control unit for controlling said third switching unit according to both the clock signals received from outside and the signal levels transmitted through said delay unit.

2. The latch circuit of claim 1 wherein said second control unit controls said second switching unit, according to the external data signals, so that said second switching unit operates in a reciprocal manner to said first switching unit.

3. The latch circuit of claim 1 wherein said memory unit holds the level of the data signal written therein when both said first and said third switching units are off.

4. The latch circuit of claim 1 wherein said first, second, and third switching units each comprise a MOS transistor.

5. The latch circuit of claim 1 wherein said third control unit comprises a two-input AND circuit and also turns on said third switching unit when the level of each of the two inputs of said AND circuit is "H".

6. A latch circuit operating in synchronization with clock signals comprising:
   a memory unit including a first inverter and a second inverter, the output terminal of said first inverter being connected to the input terminal of said second inverter and the output terminal of said second inverter being connected to the input terminal of said first inverter;
   a first switching unit coupling the input terminal of said first inverter of said memory unit with the ground;
   a second switching unit connected between the ground and the input terminal of said second inverter of said memory unit;
   a first control unit for controlling said first switching unit according to binary data signals received from outside;
   a delay unit for transmitting, with delay, the signal level at the input terminal of said second inverter of said memory unit; and
   a second control unit for controlling said second switching unit according to the data signals from outside, the clock signals from outside, and the signal levels transmitted through said delay unit.

7. The latch circuit of claim 6 wherein said second control unit turns off said second switching unit when said first switching unit is on.

8. The latch circuit of claim 6 wherein said memory unit holds the level of the data signal written therein when both said first and second switching units are off.

9. The latch circuit of claim 6 wherein said first and second switching units each comprise a MOS transistor.

10. A latch circuit operating in synchronization with clock signals comprising:
    a memory unit including a first inverter and a second inverter, the output terminal of said first inverter being connected to the input terminal of said second inverter and the output terminal of said second inverter being connected to the input terminal of said first inverter;
    a first switching unit coupling the input terminal of said second inverter with the power supply;
    a second switching unit connected between the ground and the input terminal of said first inverter of said memory unit;
    a first control unit for controlling said first switching unit according to binary data signals received from outside;
    a delay unit for transmitting, with delay, the signal level at the input terminal of said second inverter of said memory unit; and
    a second control unit for controlling said second switching unit according to the data signals from outside, the clock signals from outside, and the signal levels transmitted through said delay unit.

11. The latch circuit of claim 10 wherein said second control unit turns off said second switching unit when said first switching unit is on.

12. The latch circuit of claim 10 wherein said memory unit holds the level of the data signal written therein when both said first and second switching units are off.

13. The latch circuit of claim 10 wherein said first and second switching units each comprise a MOS transistor.

14. The latch circuit of claim 10 wherein said second control unit comprises a three-input AND circuit and turns on said second switching unit when the level of each input terminal of said AND circuit is "H".

15. The latch circuit of claim 10 wherein the input terminal of said delay circuit is connected to the output terminal of said second inverter of said memory unit through at least one inverter.

16. A latch circuit operating in synchronization with clock signals comprising:

a memory unit including an inverter, a first switching unit connected between the input terminal of said inverter and the power supply, and a second switching unit connected between the output terminal of said inverter and the ground;

a third switching unit connected between the input terminal of said inverter and the power supply;

a fourth switching unit connected between the input terminal of said inverter and the ground;

a first control unit for controlling said third switching unit according to binary data signals received from outside;

a delay unit for transmitting, with delay, the signal level at the input terminal of said inverter of said memory unit; and a second control unit for controlling said fourth switching unit according to the data signals from outside, the clock signals from outside, and the signal levels transmitted through said delay unit, said first switching unit operating according to the signal level of the output terminal of said inverter and the output control signal level produced by said second control unit, and said second switching unit operating according to the signal level of the output terminal of said inverter and the output control signal level produced by said first control unit.

17. The latch circuit of claim 16 wherein said first switching unit is off when said fourth switching unit is on, and said second switching unit is off when said third switching unit is on, said second switching unit operating in a complementary way to said first switching unit.

18. The latch circuit of claim 16 wherein said first and second switching units each comprise a plurality of MOS transistors connected in series.

19. The latch circuit of claim 16 wherein said first control unit turns off said third switching unit when said fourth switching unit is on while said second control unit turns off said fourth switching unit when said third switching unit is on.

20. The latch circuit of claim 16 wherein said second control unit comprises a three-input AND circuit and turns on said fourth switching unit when the level of each input terminal of said AND circuit is "H".

* * * * *